(12) United States Patent
Moreira

(10) Patent No.: US 11,747,383 B2
(45) Date of Patent: Sep. 5, 2023

(54) DETERMINING PERFORMANCE METRICS FOR A DEVICE UNDER TEST USING NEARFIELD MEASUREMENT RESULTS

(71) Applicant: Advantest Corporation, Tokyo (JP)

(72) Inventor: José Moreira, Stuttgart (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/831,200

(22) Filed: Jun. 2, 2022

(65) Prior Publication Data

US 2022/0291271 A1  Sep. 15, 2022

Related U.S. Application Data

(63) Continuation of application No. PCT/EP2020/051535, filed on Jan. 22, 2020.

(51) Int. Cl.
*G01R 27/32* (2006.01)
*G01R 29/10* (2006.01)
*H04B 5/00* (2006.01)

(52) U.S. Cl.
CPC ......... *G01R 29/105* (2013.01); *H04B 5/0043* (2013.01)

(58) Field of Classification Search
CPC .. G01R 29/10; G01R 29/105; G01R 29/0864; G01R 29/0871; G01R 29/0892; G01R 29/26; H04B 5/0043; H04B 17/11; H04B 17/12; H04B 17/16; H04B 17/24; H04B 17/29; H04B 17/102; H04B 17/318
See application file for complete search history.

(56) References Cited

U.S. PATENT DOCUMENTS

| | | |
|---|---|---|
| 7,119,739 B1 | 10/2006 | Struckman |
| 10,707,976 B1 * | 7/2020 | Derat ................ H04B 17/12 |
| 11,081,788 B1 * | 8/2021 | Hahn, III ............ H04B 17/102 |
| 11,251,840 B1 * | 2/2022 | Wen ................ H04B 7/043 |
| 2018/0337738 A1 * | 11/2018 | Wen ................ H04B 17/309 |

FOREIGN PATENT DOCUMENTS

CN  108983228 A  12/2018

* cited by examiner

*Primary Examiner* — Thang X Le

(57) ABSTRACT

Embodiments of the present invention provide systems and methods for performing tests on a device under test (DUT) based on training data derived from a set of training DUTs using nearfield measurement data. Nearfield measurement data can be mapped to performance metrics that approximate performance metrics derived from the far-field measurement data. Nearfield measurements can then be performed on a DUT to generate second nearfield measurement data, and performance metrics of the DUT are generated using the second nearfield measurement data and the mapped performance metrics derived from the training DUTs.

20 Claims, 4 Drawing Sheets

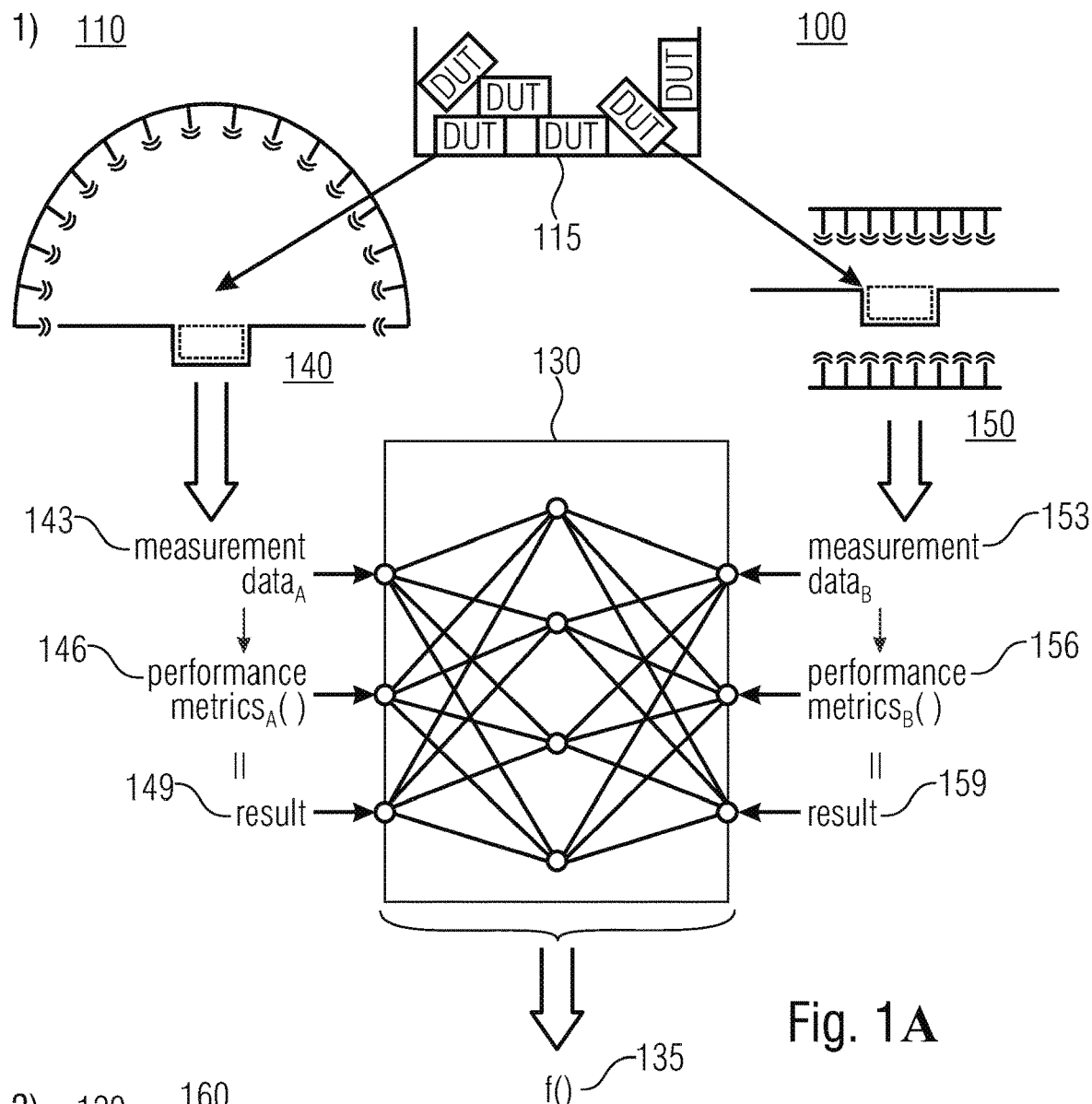
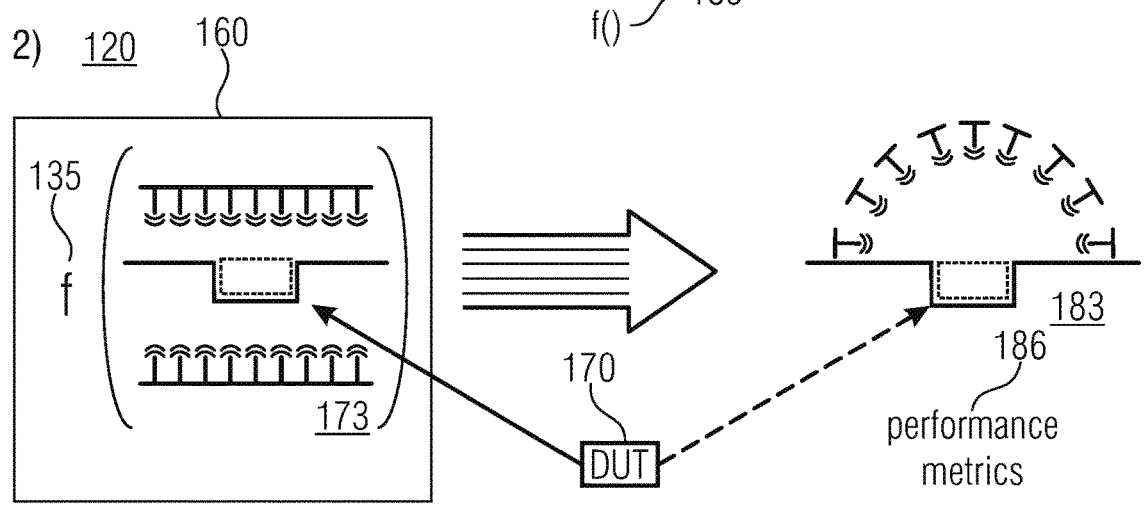
Fig. 1A
Fig. 1B

DETERMINING PERFORMANCE METRICS FOR A DEVICE UNDER TEST USING NEARFIELD MEASUREMENT RESULTS

CROSS-REFERENCE TO RELATED APPLICATIONS

This application claims the benefit of and priority to international patent application PCT/EP2020/051535, with filing date Jan. 22, 2020, which is hereby incorporated by reference in its entirety.

FIELD

Embodiments of the present invention relate to device under test (DUT) testing. More specifically, embodiments relate to techniques for deriving a performance metric of a DUT based on measurement results.

BACKGROUND

Recent developments in automated test equipment (ATE) for DUT testing have enabled over-the-air (OTA) testing or probing of the antennas and/or antenna arrays of a DUT in the reactive nearfield or radiating nearfield. Common DUT testing methods include far-field OTA measurements as well. Measurement antennas probe or test the antennas or antenna arrays of a given DUT, and both nearfield and far-field measurements can be used to rate the quality of the DUT antennas and/or antenna arrays by defining a performance metric.

However, there exists a need in the field of DUT testing to improve the significance of performance metrics in nearfield measurements without significantly increasing the effort needed to reach the significance level.

SUMMARY

Accordingly, embodiments of the present invention provide systems and methods for performing tests on a device under test (DUT) based on training data derived from a set of training DUTs using nearfield measurement data. Nearfield measurement data can be mapped to performance metrics that approximate performance metrics derived from the far-field measurement data. Nearfield measurements can then be performed on a DUT to generate second nearfield measurement data, and performance metrics of the DUT are generated using the second nearfield measurement data and the mapped performance metrics derived from the training DUTs.

According to one embodiment, a method of calculating performance metrics for testing a device under test (DUT) is disclosed. The method includes performing far-field measurements on a set of training DUTs to generate far-field measurement data, determining performance metrics of the set of training DUTs based on the far-field measurement data, performing nearfield measurements on the set of training DUTs using automatic test equipment to generate first nearfield measurement data, mapping the first nearfield measurement data to mapped performance metrics that approximate the performance metrics based on the far-field measurement data, performing nearfield measurements on a DUT to generate second nearfield measurement data, and generating performance metrics of the DUT using the second nearfield measurement data and the mapped performance metrics.

According to some embodiments, mapping the first nearfield measurement data to mapped performance metrics includes using machine learning to approximate the performance metrics based on the far-field measurement data.

According to some embodiments, mapping the first nearfield measurement data to mapped performance metrics includes using a statistical learning engine to approximate the performance metrics based on the far-field measurement data.

According to some embodiments, mapping the first nearfield measurement data to mapped performance metrics includes using at least one of: a neural network; a Bayesian classification; a statistical learning unit; an artificial intelligence unit; and a machine learning unit, configured to receive the first nearfield measurement data as input quantities and to provide the mapped performance metrics as output quantities.

According to some embodiments, the mapped performance metrics include a pass/fail criteria.

According to some embodiments, the method includes deriving a plurality of values from the performance metrics, and the plurality of values quantitatively describe a performance of the DUT.

According to some embodiments, the performing far-field measurements on a set of training DUTs includes performing far-field measurements on the set of training DUTs in an anechoic chamber.

According to some embodiments, the anechoic chamber includes a moveable measurement antenna.

According to some embodiments, the automatic test equipment includes a measurement antenna with a fixed position.

According to some embodiments, the automatic test equipment includes two nearfield antennas disposed at opposite sides of the DUT.

According to some embodiments, the automatic test equipment includes at least one nearfield antenna disposed next to the DUT.

According to a different embodiment, a system for obtaining performance metrics for testing a device under test (DUT) is disclosed. The system includes an automatic test equipment operable to perform far-field measurements on a set of training DUTs to generate far-field measurement data stored in memory, perform nearfield measurements on the set of training DUTs using the automatic test equipment to generate first nearfield measurement data, and perform nearfield measurements on a DUT to generate second nearfield measurement data. The system further includes a memory and a processor coupled to the memory. The processor is operable to determine performance metrics of the set of training DUTs based on the far-field measurement data stored in the memory, map the first nearfield measurement data to mapped performance metrics that approximate the performance metrics based on the far-field measurement data, and generate performance metrics of the DUT using the second nearfield measurement data and the mapped performance metrics.

According to another embodiment, a non-transitory computer-readable storage medium having embedded therein program instructions, which when executed by one or more processors of a device, causes the device to execute a method of obtaining performance metrics for testing a device under test (DUT), is disclosed. The method includes performing far-field measurements on a set of training DUTs to generate far-field measurement data, determining performance metrics of the set of training DUTs based on the far-field measurement data, performing nearfield measurements on the set of training DUTs using automatic test equipment to generate first nearfield measurement data, mapping the first nearfield measurement data to mapped performance metrics that approximate the performance metrics based on the far-field measurement data, performing nearfield measurements on a DUT to generate second nearfield measurement data, and generating performance metrics of the DUT using the second nearfield measurement data and the mapped performance metrics.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1A is a diagram and flow chart of an exemplary system that uses training DUTs to map measurement data to performance metrics for testing a DUT according to embodiments of the present invention.

FIG. 1B is a diagram and flow chart of an exemplary system for obtaining performance metrics during testing of a DUT according to embodiments of the present invention.

DETAILED DESCRIPTION

Figure 2:
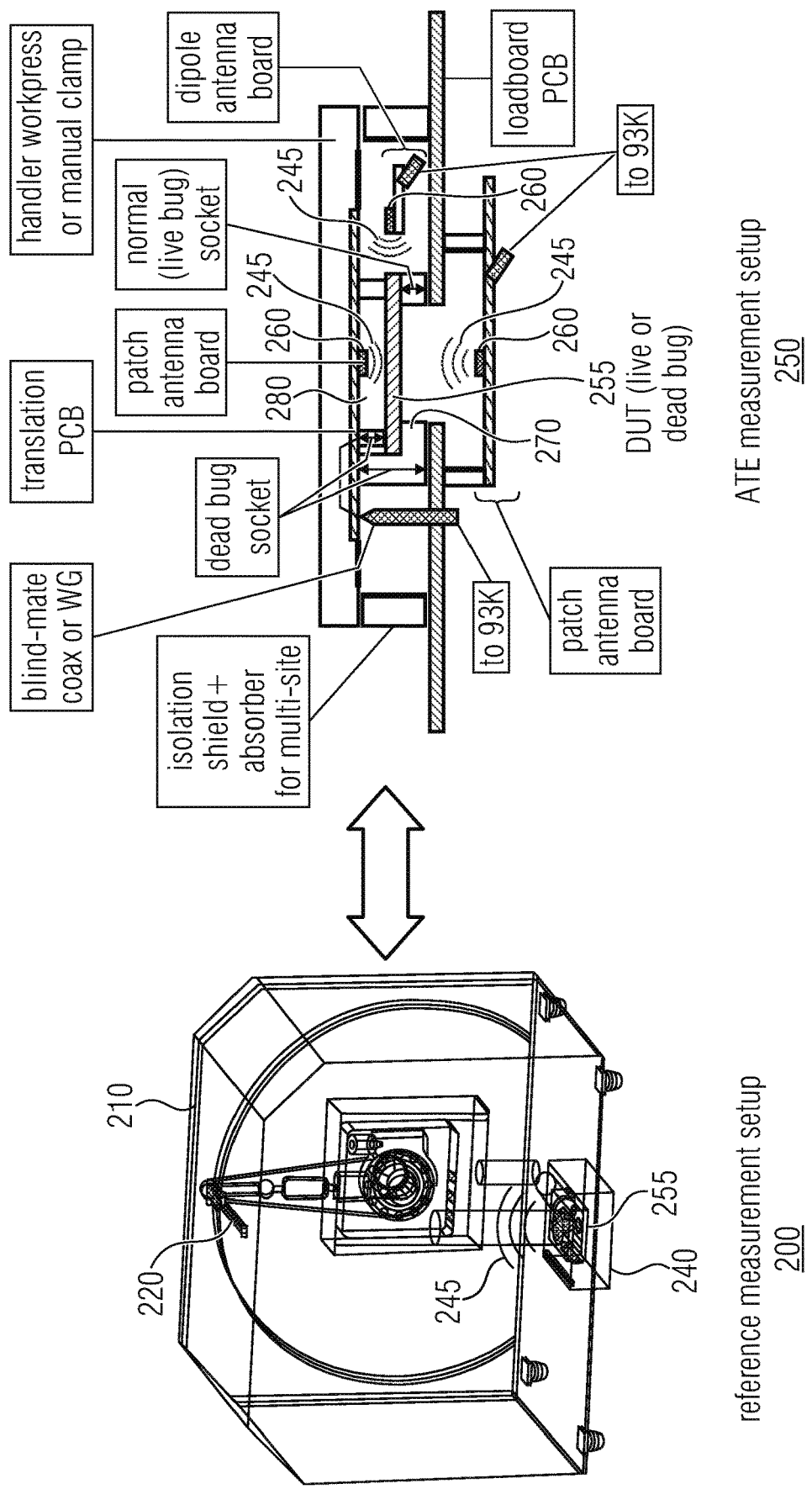
FIG. 2 is a diagram depicting an exemplary far-field measurement device and an exemplary nearfield measurement device for DUT testing according to embodiments of the present invention.

In the following, various embodiments of the present invention and aspects will be described. Also, further embodiments will be defined by enclosed claims.

It should be noted, that any embodiments as defined by the claims can be supplemented by any of the details, features and functionalities described herein. Also, the embodiments described herein can be used individually, and can also optionally be supplemented by any of the details, features and functionalities included in the claims.

Also, it should be noted, that individual aspects described herein can be used individually or in combination. Thus, details can be added to each of said individual aspects without adding details to another one of said aspects.

Further, it should be noted, that the present disclosure describes, explicitly or implicitly, features usable in a system and/or a method for obtaining a performance metric of a DUT. Thus, any of the features described herein can be used in the context of a system and/or a method for obtaining a performance metric of a DUT.

Moreover, features and functionalities disclosed herein relating to a method can also be used in an apparatus, configured to perform such functionality. Furthermore, any features and functionalities disclosed herein with respect to an apparatus can also be used in a corresponding method. In other words, the method disclosed herein can be supplemented by any of the features and functionalities described with respect to the apparatuses.

The invention will be understood more fully from the detailed description given below, and from the accompanying drawings of embodiments of the invention, which, however, should not be taken to limit the invention to the specific embodiments described, but are for explanation and understanding only.

Determining Performance Metrics for a Device Under Test

Embodiments of the present invention provide systems and methods for performing tests on a device under test (DUT) based on training data derived from a set of training DUTs using nearfield measurements. Nearfield measurement data can be stored in memory and mapped to performance metrics that approximate performance metrics derived from the far-field measurement data. Nearfield measurements can then be performed on a DUT to generate second nearfield measurement data, and performance metrics of the DUT are generated using the second nearfield measurement data and the mapped performance metrics derived from the training DUTs.

FIGS. 1A and 1B are diagrams of an exemplary operation 100 performed by a system for determining a performance metric 186 for DUT testing according to embodiments of the present invention. The operation 100 includes at least two phases: phase 1 110 and phase 2 120.

Phase 1 110 of the operation 100 includes conducting measurements on a selected set of sample DUTs or training DUTs 115. The measurements of the training DUTs 115 include far-field measurements conducted in a far-field measurement device 140 and nearfield measurements conducted in a nearfield measurement device 150.

A test apparatus 130 obtains measurement results or measurement data 143, 153 and performance metrics or criteria 146, 156 based on the measurement data and the outcome or result values 149, 159. The test apparatus 130 is configured to provide a mapping 135 based on information obtained from a far-field measurement 143, 146, 149, and based on information obtained from nearfield measurements 153, 156, 159.

A mapping 135 is provided by the test apparatus 130 based on the conducted far-field measurements in a far-field measurement device 140 and on the conducted nearfield measurements in a nearfield measurement device 150 on the same set of training DUTs 115. The obtained mapping 135 is used in phase 2 120 of the operation 100.

Phase 2 120 of the operation 100 includes using an apparatus 160, which can be a separate apparatus 160, or a component of the test apparatus 130 used in phase 1 110. The apparatus 160 includes mapping 135 provided by the test apparatus 130 or by another component of the test apparatus 130 of phase 1 110. Nearfield measurement data 173 is provided to the mapping 135 of the apparatus 160, where the measurement data corresponds to an unknown DUT 170. By applying mapping 135 to the measurement results 173, the apparatus 160 provides performance metrics 186 which approximate performance metrics corresponding to hypothetical far-field measurements conducted in a hypothetical far-field measurement device 183. In other words, operation 100 is configured to obtain a mapping 135 in phase 1 110 and to provide performance metrics 186 by applying the mapping 135 on nearfield measurement results 173 conducted on one or more unknown DUTs.

Phase 1 110 can be considered a training phase where a selected set of DUTs 115 are measured both in a far-field measurement device 140 and in a nearfield measurement device 150. The selected set of DUTs 115 are selected so that the outcome or results of a performance metrics applied on the measurement data covers (or nearly covers) the complete spectrum of possible results of the performance metrics in order to prepare mapping 135 for as many results or use cases as possible.

Measurement data, performance metrics, and results of far-field measurement 143, 146, 149, along with measurement data, performance metrics, and results of nearfield measurement 153, 156, 159, are provided to test apparatus 130. The performance metrics characterize a performance aspect of a DUT using one or more values. Outcomes or results 149, 159 of performance metrics 146, 156 are the values of performance metrics of far-field measurements 140 or nearfield measurements 150, which can include the same and/or similar values when the same DUT is measured in a nearfield and in a far-field measurement device 140,150. For example, when using a pass/fail performance metrics, the results 149,159 may be the same.

The test apparatus 130 can use machine learning, a statistical learning engine, and/or an artificial intelligence engine to produce mapping 135 based on the measurement data 143, 153, the performance metrics 146, 156, and the outcome of the performance metrics 149, 159 applied on the measurement data 143, 153 obtained from far-field measurement device 140 and from nearfield measurement device 150. The test apparatus 130 provides mapping 135 which can be used in the second phase 120 of the operation 100.

The apparatus 160, which can be the same apparatus as the test apparatus 130 of phase 1 110, applies mapping 135 provided by the test apparatus 130 of phase 1 110 to the nearfield measurement data 173 of an unknown DUT 170 to provide a performance metrics 186 that approximates the performance metrics of a hypothetical far-field measurement conducted in a hypothetical far-field measurement device 183.

FIG. 2 is a diagram depicting exemplary far-field measurement device 200 and nearfield measurement device 250 according to embodiments of the present invention. Nearfield and far-field measurements are conducted on a plurality of training DUTs 255, selected in a way to cover a complete spectrum, or at least a widespread range of possible outcomes. The far-field measurement device includes DUT-location 240 in chamber 210, which can be an anechoic chamber 210, and a moveable measurement antenna 220, capable of moving around DUT-location 240.

In a far-field measurement device 200, a DUT 255 is placed in a DUT-location 240 in an anechoic chamber 210. In the chamber 210, a moveable measurement antenna 220 is configured to be moved around the DUT 255 to measure the signals 245 received from the DUT 255. The moveable antenna 220 can also transmit a signal while moving around the DUT 255, while the DUT receives and/or measures the signals of the moveable antenna 220. The signal received from the moveable antenna 220 or from the DUT 255 is provided to the test apparatus 130 on FIG. 1A.

Nearfield measurement are performed in a nearfield measurement device 250, which can be similar to the nearfield measurement device 150 on FIG. 1A. The nearfield measurement device 250 includes a DUT-location 270 in a chamber 280 with a plurality of measurement antennas 260. Chamber 280 can be an anechoic chamber 280, and the walls around the chamber 280 can absorb disturbing signals from outside of the chamber 280 from echoes of the signals 245 transmitted by the DUT 255, or from one or more measurement antennas 260.

The plurality of antennas 260 are fixed within the chamber 280. The antennas are positioned around the DUT 255, for example, at opposite sides or at opposite main surfaces of the DUT 255, and additional antennas 260 can be arranged laterally next to the DUT 255. The probed DUT 255 is configured to emit a signal 245. A plurality of antennas 260 receive different versions of the emitted signal 245 and the different versions of the signal 245 are provided to the test apparatus 130 of FIG. 1A. In some cases, the antennas 260 may emit different signals 245, and the DUT 255 receives the signals 245 emitted by the different antennas 260. The received and/or measured signals 245 are provided to the test apparatus 130 on FIG. 1A.

The measured signals and/or the measurement results of far-field measurement device 200 and nearfield measurement device 250 are provided to the test apparatus 130 of FIG. 1A in order to generate a mapping using a statistical engine, an artificial intelligence module, and/or a machine learning module. The mapping provided by the apparatus can be used to determine performance metrics by applying the mapping to the nearfield measurement results from nearfield measurement device 250.

Figure 3:
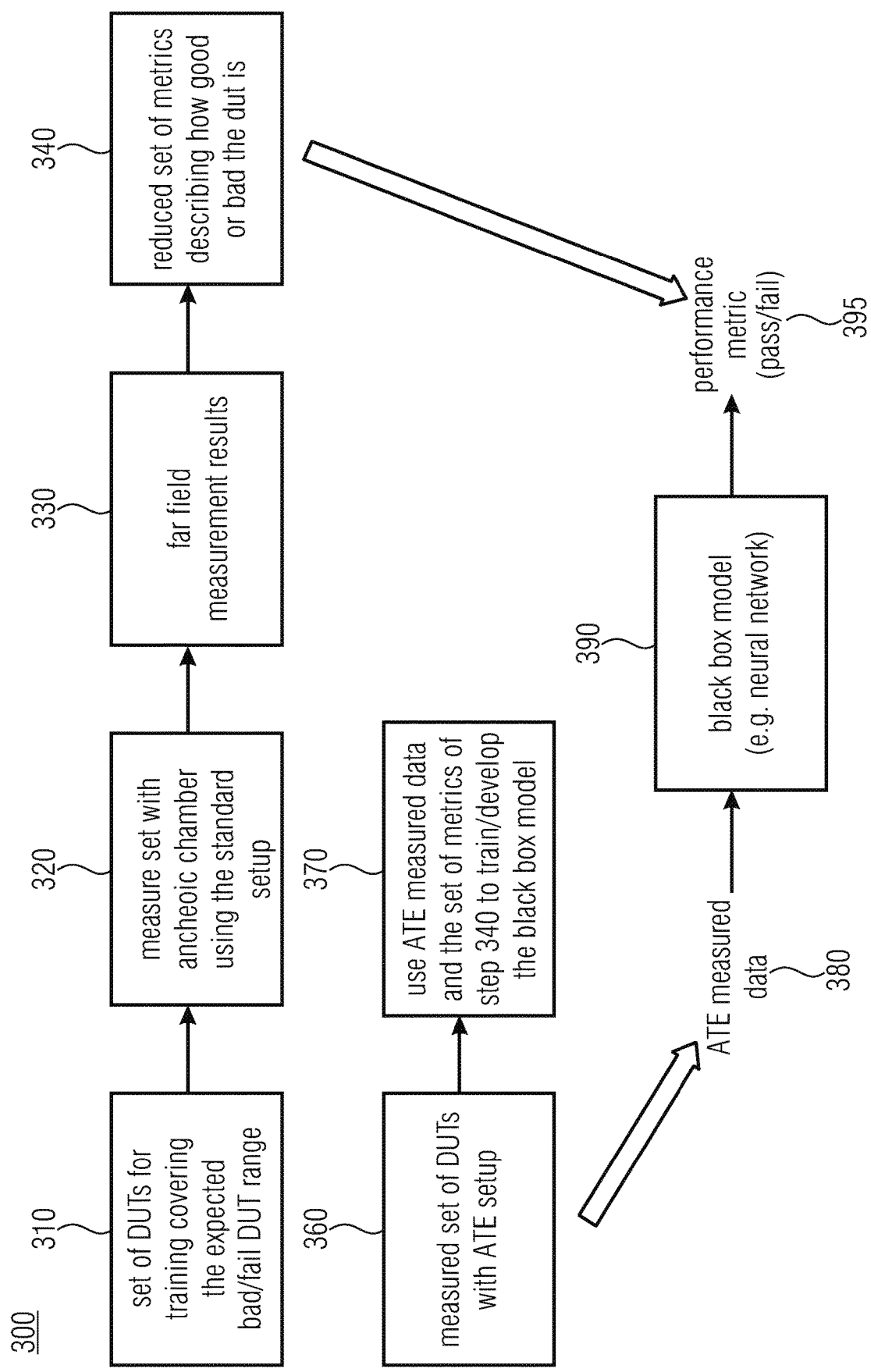
FIG. 3 is a flow chart of an exemplary sequence of computer implemented steps of a first phase for determining a performance metric for testing a DUT according to embodiments of the present invention.

FIG. 3 is a flow chart depicting an exemplary sequence of computer implemented steps of a process 300 for performing a first phase of a two-phase process to generate performance metrics diagram according to embodiments of the present invention.

At step 310, a set of DUTs is selected for a training phase used to generate performance metrics. The selected DUTs covers all or part of the range of expected outcomes, including bad DUTs or fail DUTs.

At step 320, the DUTs in the selected set of DUTs are measured in a chamber (e.g., an anechoic chamber) in the far-field measurement device, similar to a measurement device 200 of FIG. 2.

The far-field measurement results are obtained at step 330.

At step 340, the far-field measurement results are reduced to an essential set of metrics describing how good or bad the measured DUT is. The number of values in the performance metrics are limited by the number of values in far-field measurements. The results are stored in computer readable memory.

At step 360, the measured DUTs of the set of DUTs are measured again in a nearfield measurement device (e.g., nearfield measurement device 250 of FIG. 2). The model is memory resident.

At step 370, the nearfield measurement data measured in a nearfield measurement device or in an ATE at step 360 and the set of metrics or reduced metrics provided by step 340 are used to create, train and/or develop a black box model or a neural network.

After creating, training and/or developing a black box model 390, the nearfield measurement data and ATE measurement data 380 are provided to the black box model or to neural network 390.

The black box model applied to the nearfield measurement results provided by step 360 provide the same results or performance metrics 395 as the reduced set of metrics provided by the step 340.

The sequence of steps 300 can be performed using operation 100 of FIGS. 1A and 1B, and a black box model or a neural network 390 is trained 370 with selected training DUTs 310 based on a reduced set of metrics 340 and on measurement data of a nearfield or ATE setup in step 360. The reduced set of metrics 340 is based on far-field measurement results 330.

The training DUTs can be selected 310 to cover the expected range of outcomes. The training DUTs are measured both in a far-field measurement device 200 of FIG. 2 and in an ATE or nearfield measurement device 250 of FIG. 2.

Figure 4:
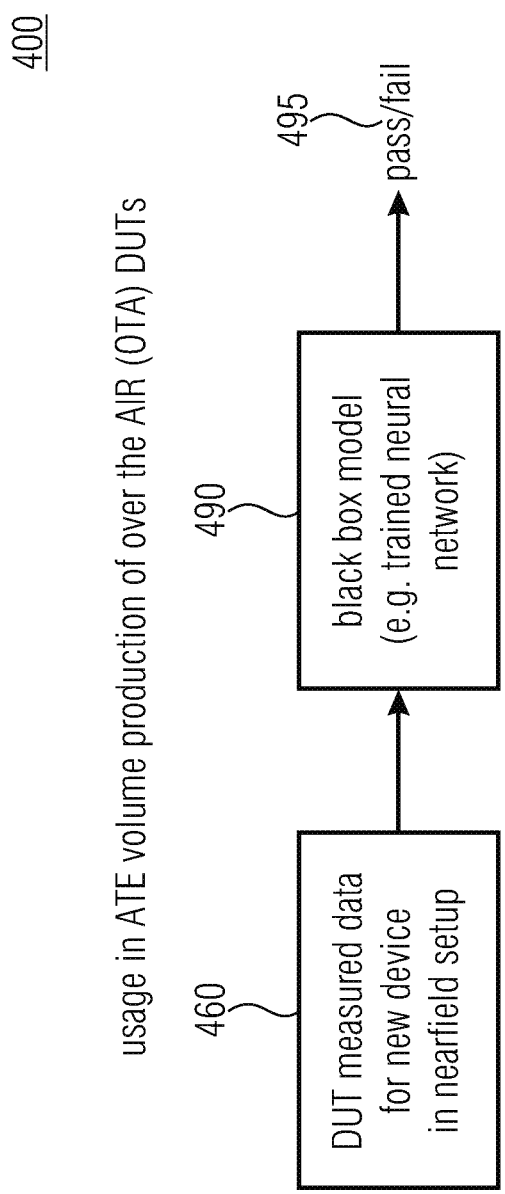
FIG. 4 is a flow chart of an exemplary sequence of computer implemented steps of a second phase performed after the first phase depicted in FIG. 3 for determining a performance metric for testing a DUT according to embodiments of the present invention.

FIG. 4 is a flow chart depicting an exemplary sequence of computer implemented steps of a process 400 for performing phase 2 120 depicted in FIG. 1B to test a DUT according to embodiments of the present invention. Process 400 includes using a black box model 490 or a trained black box model 490 in an OTA testing production environment, and includes measuring data of a new or unknown DUT in a nearfield setup, for example, in nearfield setup 250 of FIG. 2. The measured data is used as input for the trained neural network or for the trained black box model 490, and the trained black box model 490 provides an outcome 495, which can include a pass/fail determination.

For example, process 400 can use a trained black box model or neural network at step 490 in an ATE volume production mode of an OTA DUT test environment. The black box model or the neural network can be trained, for example, in step 370 of FIG. 3. Moreover, an unknown/untested DUT, similar to the unknown DUT 170 of FIG. 1B, can be measured in a nearfield setup at step 460. The measured data is provided to an apparatus, which includes the mapping and/or to a trained black box model 490, to provide a performance metric 495 which can be a pass/fail metric, according to embodiments.

According to some embodiments, a statistical learning engine and/or an artificial intelligence engine are used to determine pass/fail criteria correlation between full far-field measurements of a DUT performed in a compliant anechoic chamber with a fully movable measurement antenna, and between the nearfield measurements performed using one or more fixed antenna located in the near field or in the reactive near field (e.g., very close to the DUT) including an integrated circuit or a module with integrated antennas.

Using a statistical learning engine and/or an artificial intelligence engine can completely avoid the very complex or in some cases impossible task of correlating the measurements conducted in an anechoic chamber or in a far-field measurement device with the measurements conducted in an ATE or nearfield measurement device using one or more antennas.

In order to provide pass/fail criteria for OTA testing of an ATE production test cell where the measurement antenna is static (e.g., its physical position is fixed) and in the near field, the sample set of DUTs is defined to cover as much of the expected range of good and bad devices as possible. The sample devices are then classified as good or bad, and the performance of the device (e.g., how good or how bad) can be described depending on the application. The same devices are then inserted on the ATE system where tests are run using the single antenna setup in the near field with the ATE system measuring several values (e.g. ANT X power or ANT X+ANT Y power). Using this data, a black box model can be created using techniques such as statistical learning, Bayesian classification, artificial intelligence, etc., where the input is the ATE measurements and the output is a pass/fail criteria.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention include a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code can for example be stored on a machine readable carrier.

Other embodiments include the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) including, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals can for example be configured to be transferred via a data communication connection, for example via the interne.

A further embodiment includes a processing means, for example a computer, or a programmable logic device, configured to or adapted to perform one of the methods described herein.

A further embodiment includes a computer having installed thereon the computer program for performing one of the methods described herein.

A further embodiment according to the invention includes an apparatus or a system configured to transfer (for example, electronically or optically) a computer program for performing one of the methods described herein to a receiver. The receiver can, for example, be a computer, a mobile device, a memory device or the like. The apparatus or system can, for example, include a file server for transferring the computer program to the receiver.

In some embodiments, a programmable logic device (for example a field programmable gate array) can be used to perform some or all of the functionalities of the methods described herein. In some embodiments, a field programmable gate array can cooperate with a microprocessor in order to perform one of the methods described herein. Generally, the methods are preferably performed by any hardware apparatus.

The apparatus described herein can be implemented using a hardware apparatus, or using a computer, or using a combination of a hardware apparatus and a computer.

The apparatus described herein, or any components of the apparatus described herein, can be implemented at least partially in hardware and/or in software.

The methods described herein can be performed using a hardware apparatus, or using a computer, or using a combination of a hardware apparatus and a computer.

Embodiments of the present invention are thus described. While the present invention has been described in particular embodiments, it should be appreciated that the present invention should not be construed as limited by such embodiments, but rather construed according to the following claims.

What is claimed is:

1. A method of calculating performance metrics for testing a device under test (DUT), the method comprising:
performing far-field measurements on a set of training DUTs to generate far-field measurement data;
determining performance metrics of the set of training DUTs based on the far-field measurement data;
performing nearfield measurements on the set of training DUTs using automatic test equipment to generate first nearfield measurement data;
mapping the first nearfield measurement data to mapped performance metrics that approximate the performance metrics based on the far-field measurement data;
performing nearfield measurements on a DUT to generate second nearfield measurement data; and
generating performance metrics of the DUT using the second nearfield measurement data and the mapped performance metrics.

2. The method of claim 1, wherein said mapping the first nearfield measurement data to mapped performance metrics comprises using machine learning to approximate the performance metrics based on the far-field measurement data.

3. The method of claim 1, wherein said mapping the first nearfield measurement data to mapped performance metrics comprises using a statistical learning engine to approximate the performance metrics based on the far-field measurement data.

4. The method of claim 1, wherein said mapping the first nearfield measurement data to mapped performance metrics comprises using at least one of: a neural network; a Bayesian classification; a statistical learning unit; an artificial intelligence unit; and a machine learning unit, configured to receive the first nearfield measurement data as input quantities and to provide the mapped performance metrics as output quantities.

5. The method of claim 1, wherein the mapped performance metrics comprise a pass/fail criteria.

6. The method of claim 1, further comprising deriving a plurality of values from the performance metrics, wherein the plurality of values quantitatively describe a performance of the DUT.

7. The method of claim 1, wherein the performing far-field measurements on a set of training DUTs comprises performing far-field measurements on the set of training DUTs in an anechoic chamber.

8. The method of claim 7, wherein the anechoic chamber comprises a moveable measurement antenna.

9. The method of claim 1, wherein the automatic test equipment comprises a measurement antenna with a fixed position.

10. The method of claim 1, wherein the automatic test equipment comprises two nearfield antennas disposed at opposite sides of the DUT.

11. The method of claim 1, wherein the automatic test equipment comprises at least one nearfield antenna disposed next to the DUT.

12. A system for obtaining performance metrics for testing a device under test (DUT), the system comprising:
an automatic test equipment operable to:
perform far-field measurements on a set of training DUTs to generate far-field measurement data stored in memory;
perform nearfield measurements on the set of training DUTs using the automatic test equipment to generate first nearfield measurement data; and
perform nearfield measurements on a DUT to generate second nearfield measurement data;
a memory; and
a processor coupled to the memory, wherein the processor is operable to:
determine performance metrics of the set of training DUTs based on the far-field measurement data stored in the memory;
map the first nearfield measurement data to mapped performance metrics that approximate the performance metrics based on the far-field measurement data; and
generate performance metrics of the DUT using the second nearfield measurement data and the mapped performance metrics.

13. The system of claim 12, wherein said map the first nearfield measurement data to mapped performance metrics comprises using machine learning to approximate the performance metrics based on the far-field measurement data.

14. The system of claim 12, wherein said map the first nearfield measurement data to mapped performance metrics comprises using a statistical learning engine to approximate the performance metrics based on the far-field measurement data.

15. The system of claim 12, wherein said map the first nearfield measurement data to mapped performance metrics comprises using at least one of: a neural network; a Bayesian classification; a statistical learning unit; an artificial intelligence unit; and a machine learning unit, configured to receive the first nearfield measurement data as input quantities and to provide the mapped performance metrics as output quantities.

16. The system of claim 12, wherein the mapped performance metrics comprise a pass/fail criteria.

17. The system of claim 12, wherein the processor is further operable to derive a plurality of values from the performance metrics, wherein the plurality of values quantitatively describe a performance of the DUT.

18. The system of claim 12, wherein the perform far-field measurements on a set of training DUTs comprises performing far-field measurements on the set of training DUTs in an anechoic chamber.

19. The system of claim 18, wherein the anechoic chamber comprises a moveable measurement antenna.

20. A non-transitory computer-readable storage medium having embedded therein program instructions, which when executed by one or more processors of a device, causes the device to execute a method of obtaining performance metrics for testing a device under test (DUT), the method comprising:
performing far-field measurements on a set of training DUTs to generate far-field measurement data;
determining performance metrics of the set of training DUTs based on the far-field measurement data;

performing nearfield measurements on the set of training DUTs using automatic test equipment to generate first nearfield measurement data;
mapping the first nearfield measurement data to mapped performance metrics that approximate the performance metrics based on the far-field measurement data;
performing nearfield measurements on a DUT to generate second nearfield measurement data; and
generating performance metrics of the DUT using the second nearfield measurement data and the mapped performance metrics.

* * * * *